United States Patent
Strohbehn et al.

(10) Patent No.: US 6,930,298 B2
(45) Date of Patent: Aug. 16, 2005

(54) METHOD AND STRUCTURE FOR MINIMIZING ERROR SOURCES IN IMAGE AND POSITION SENSING DETECTORS

(75) Inventors: Kim Strohbehn, Ellicott City, MD (US); Mark N. Martin, Columbia, MD (US)

(73) Assignee: The Johns Hopkins University, Baltimore, MD (US)

( * ) Notice: Subject to any disclaimer, the term of this patent is extended or adjusted under 35 U.S.C. 154(b) by 189 days.

(21) Appl. No.: 10/398,686

(22) PCT Filed: Nov. 13, 2001

(86) PCT No.: PCT/US01/51216

§ 371 (c)(1),
(2), (4) Date: Apr. 9, 2003

(87) PCT Pub. No.: WO02/47174

PCT Pub. Date: Jun. 13, 2002

(65) Prior Publication Data

US 2004/0032983 A1 Feb. 19, 2004

Related U.S. Application Data

(60) Provisional application No. 60/248,902, filed on Nov. 15, 2000.

(51) Int. Cl.[7] .............................................. H01L 27/00
(52) U.S. Cl. ................................ 250/208.1; 250/214 C
(58) Field of Search ............................. 250/332, 208.1, 250/338.2, 338.4, 203.1

(56) References Cited

U.S. PATENT DOCUMENTS

| | | | |
|---|---|---|---|
| 4,080,532 A | * | 3/1978 | Hopper ........................ 250/332 |
| 5,332,899 A | | 7/1994 | Wolney et al. |
| 5,442,176 A | | 8/1995 | Eckel, Jr. et al. |
| 5,523,570 A | | 6/1996 | Hairston |
| 5,723,866 A | | 3/1998 | Hamilton, Jr. |

* cited by examiner

Primary Examiner—David Porta
Assistant Examiner—Tony Ko
(74) Attorney, Agent, or Firm—Albert J. Fasulo, II

(57) ABSTRACT

A method and structure for minimizing one or more non-uniformities in image and position sensing detectors are provided. The structure is directed to a focal plane processor for removing non-uniformities which distort the computation of a desired property of an object of interest in an image field. The focal plane processor is capable of selectively disconnecting one or more rows and/or columns from further processing in the imaging array for those rows and/or columns which contribute to the presence of at least one non-uniformity in a video image generated by the focal plane processor. In one embodiment, the disconnection means is embodied as pre-processing circuitry which includes row and column shift registers which provide control signals to area-of-interest (AOI) switches. In another embodiment, the pixels which comprise the focal plane array are constructed in a manner which facilitates their individual isolation.

14 Claims, 7 Drawing Sheets

stripped …

METHOD AND STRUCTURE FOR MINIMIZING ERROR SOURCES IN IMAGE AND POSITION SENSING DETECTORS

CROSS-REFERENCE TO RELATED APPLICATIONS

This application claims the benefit of prior filed co-pending U.S. provisional application Ser. No. 60/248,902 filed on Nov. 15, 2000, the contents of which are hereby incorporated by reference.

STATEMENT OF GOVERNMENTAL INTEREST

This invention was made with U.S. Government support under NASA contract no. GSC144701. The U.S. Government has certain rights in this invention.

BACKGROUND OF THE INVENTION

1. Field of the Invention

This invention relates generally to image processors of the type which are located on the focal plane of an imaging array, and more particularly to an improved image processor for removing non-uniformities which can distort the image processor's computations.

2. Description of the Related Art

The class of image sensors known as focal plane processors are integrated sensor circuits which combine some form of signal processing and an imaging array on a single die. The imaging array captures an image which strikes an array of pixel sensors lying on a focal plane. The focal plane is a light sensitive circuit on which the optical array focuses ambient light. The pixel sensors convert light into electrical signals. Generally, the focal plane is defined by the surface of a semiconductor device which has a plurality of light sensitive elements (photo-transconduction elements) formed thereon to achieve a pixel sensing capability.

The signal processing of a focal plane processor is often done in the analog domain resulting in a compact, low-power method of performing the signal computation. Due to inherent variation in fabrication processing, a large focal plane processor may have one or more pixels that provide erroneous signals, i.e., the pixel may always signal that it is being impinged with bright light when in fact this is not the case. These "bad pixels" may cause the analog computation to generate an incorrect result. Additionally, a given image may have an object in the field of view that interferes with the desired computation of some property of the desired object in the image.

As an example, image sensors are commonly used in a wide variety of image-tracking applications. One such application is that of a sun-based position sensor. In order to compute the sun's position using an imaging sensor, the sensor and associated computational circuitry must compute the centroid of the sun's image. Centroid computation is a very useful, well known quantity for image-tracking applications. Finding the centroid is an averaging process, the solution is robust to noise as well as insensitive to minor variations in illumination level. However, in practical applications, such as sun sensors, the illumination level of interfering objects that fall into the sensor's field of view (e.g., glint) may be significant enough so as to adversely affect the centroid computation, thereby causing an error in the reported sun position.

FIG. 1 is an illustration of a prior art focal plane processor 10 (integrated circuit) including an n×n array 12 of imaging pixels 13 and signal processing means, e.g., computational blocks 18, 19.

FIG. 2 is a more detailed illustration a representative imaging pixel 13 from among the plurality of imaging pixels which makes up the n×n pixel array 12. The imaging pixel 13 is shown to include transistors M1, M2 and M3, image element 22, row summing line $r_i$, column summing line $c_i$ and reset line, $reset_i$. Each pixel 13 contributes a current that is summed over the pixel's respective row and column.

Referring again to FIG. 1, the processor 10 generally operates as follows. For each column ($c_o$–$c_{n-1}$) and row ($r_0$–$r_{n-1}$) of the n×n array 12, the imaging pixels are summed (each pixel contributes a current) after an integration period yielding n summed rows and n summed columns. Each summed row is passed to the row computational block 18 and each summed column is passed to the column computational block 19. The row and column computational blocks 18, 19 use the respective n summed row and n column currents to compute some desired property of the image, e.g., a centroid. As stated above, a drawback of this prior art configuration is that in the case where one or more non-uniformities (e.g., undesirable objects, bad pixels) exist in the image, there is no provision for their removal.

Thus, an improved processor would be desirable having a capability for removing the one or more non-uniformities thereby providing a more accurate computation of the desired property of the image.

SUMMARY OF THE INVENTION

The present invention is generally directed to a focal plane processor and associated method for removing non-uniformities which can potentially distort the computation of a desired property of the image field. The method of the invention, according to one embodiment, removes identified non-uniformities in the image field by disconnecting from further processing and readout, one or more rows and/or columns of a focal plane array which contribute to the image field non-uniformities. In so doing, a more accurate computational result of some desired property of the image field is achieved.

Thus, in a first aspect, the invention relates to a method for removing one or more non-uniformities from an imaging focal plane array, the method generally comprising: observing an image (i.e., video output) produced by a focal plane array processor to identify at least one row and/or column which contributes to a non-uniformity in the produced image; and means for removing the at least one row and/or column from further processing in the focal plane array.

In a further aspect, the invention relates to a method for removing one or more non-uniformities from an imaging focal plane array, the method generally comprising: observing an image (i.e., video output) produced by a focal plane array processor to identify at least one pixel which contributes to a non-uniformity in the produced image; and means for removing the at least one pixel from further processing in the focal plane array.

Circuitry for carrying out the above methods of the present invention includes at least a focal plane array, computational circuitry and processing circuitry all formed on a single substrate. The focal plane imaging array having current summing lines along each row and column and x and y position sensitive (computation) circuitry located on the edge of the array. The computation circuitry for computing some desirable property of the image field. In a first embodiment, the circuitry further includes circuitry for selectively disconnecting one or more rows and columns from the focal plane imaging array. The disconnection circuitry includes a plurality of row and column shift registers which provide control signals to area-of-interest (AOI) switches which selectively connect/disconnect the respective rows and columns of the array.

In a further embodiment, the disconnection circuitry includes a plurality of row and column shift registers which provide control signals directly connected to the respective pixels for connecting/disconnecting the respective pixels. In this embodiment, control is more refined in the individual pixels rather than selectively disconnecting the entire rows and/or columns from further processing.

Further advantages of the improved sensor include an increased readout rate of a critical region, and enhanced sensor dynamic range due to not processing regions with very high illumination.

BRIEF DESCRIPTION OF THE DRAWINGS

The present invention may be more fully understood from the detailed description given below and from the accompanying drawings of the preferred embodiments of the invention, which, however, should not be taken to limit the invention to the specific embodiments but are for explanation and understanding only.

DETAILED DESCRIPTION OF THE PREFERRED EMBODIMENTS

Figure 1:
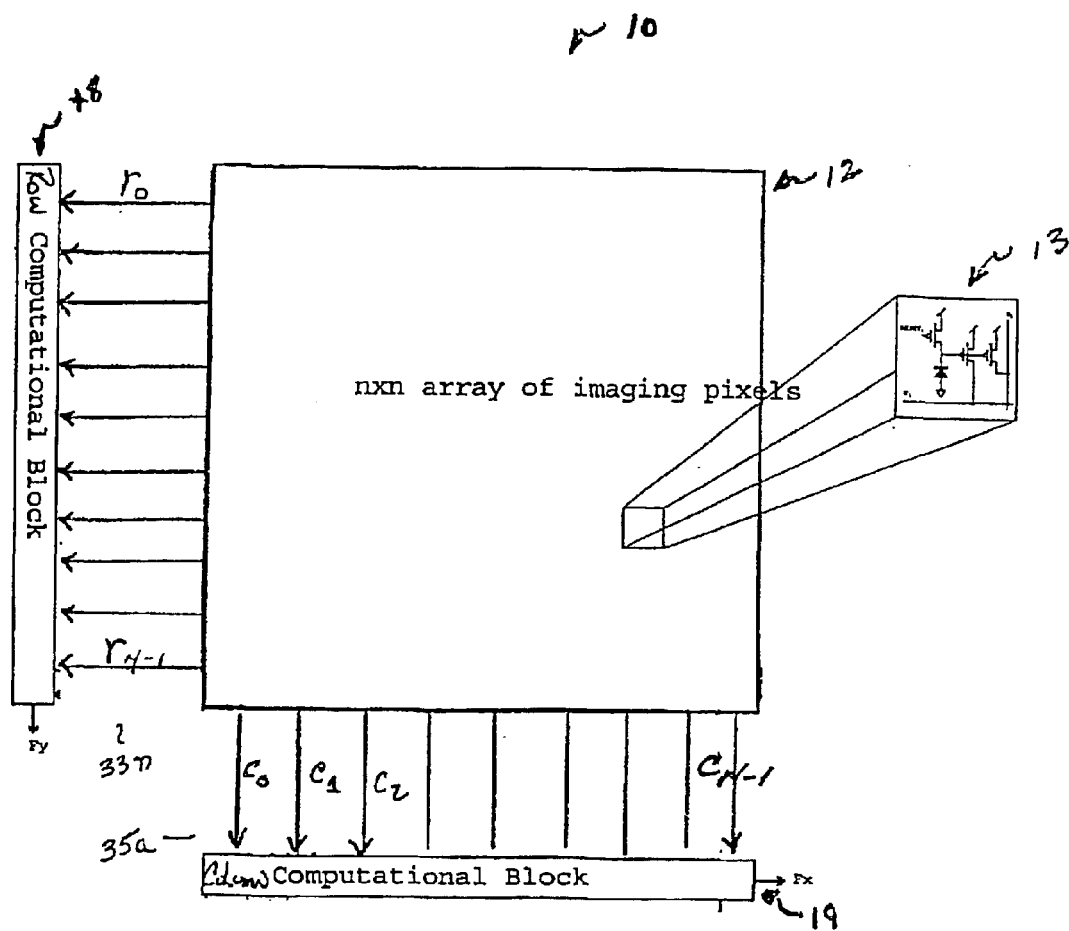
FIG. 1 is a simplified schematic of a focal plane processor constructed in accordance with the prior art.
Figure 3:
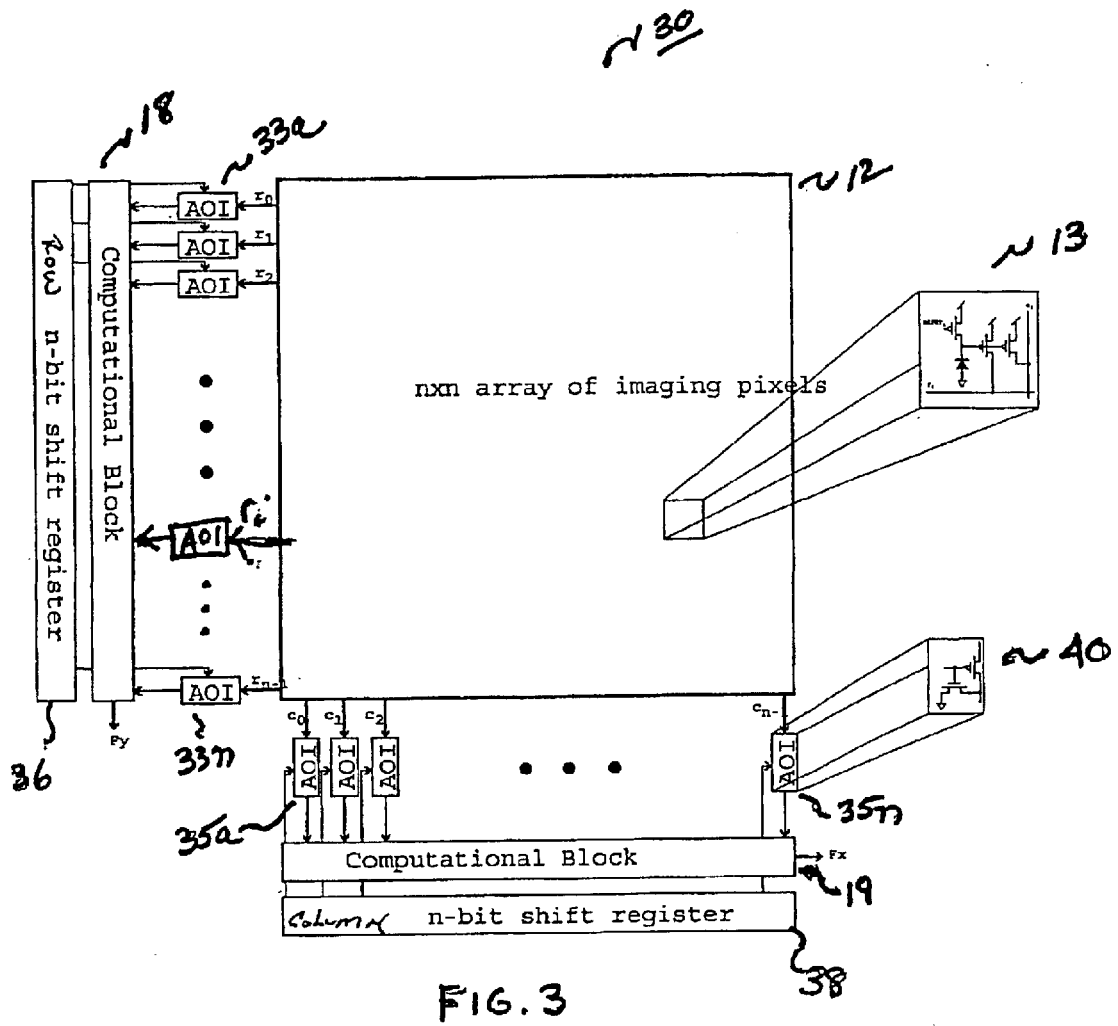
FIG. 3 is a schematic of a focal plane processor constructed in accordance with a first embodiment of the present invention.

FIG. 3 is an illustration of a focal plane processor 30 constructed in accordance with a first embodiment of the present invention. The processor 30 contains a number of components that are identical in construction, and perform identical functions, to components described above with regard to the prior art processor 10 of FIG. 1. In particular, the inventive processor 30 includes a conventional n×n array 12 of imaging pixels 13 and row and column computational blocks 18, 19. It is also contemplated that the array is an m×n array, i.e., an array having a different number of rows and columns. Also shown in FIG. 3 are components which embody the functionality of the present invention. In particular, FIG. 3 further includes row and column n-bit shift registers 36, 38, a plurality of row area-of-interest (AOI) circuits 33a–n, and a plurality of column area-of-interest (AOI) circuits 35a–n. The operation of the inventive processor circuit 30 is described as follows.

In operation, the pixels 13 in each column ($c_o$–$c_{n-1}$) and row ($r_0$–$r_{n-1}$) of the n×n array 12 are summed after each integration period. In the illustrative embodiment of FIG. 3, after one integration period, n independent row summations and n independent column summations are performed. Subsequent to performing the row and column summing operations, each summed row ($r_0$–$r_{n-1}$) is passed, via a respective row current summing line, to a respective row AOI circuit 33a–n. Similarly, each summed column ($c_o$–$c_{n-1}$) is passed, via a respective column current summing line, to a respective column AOI circuit 35a–n.

Figure 4:
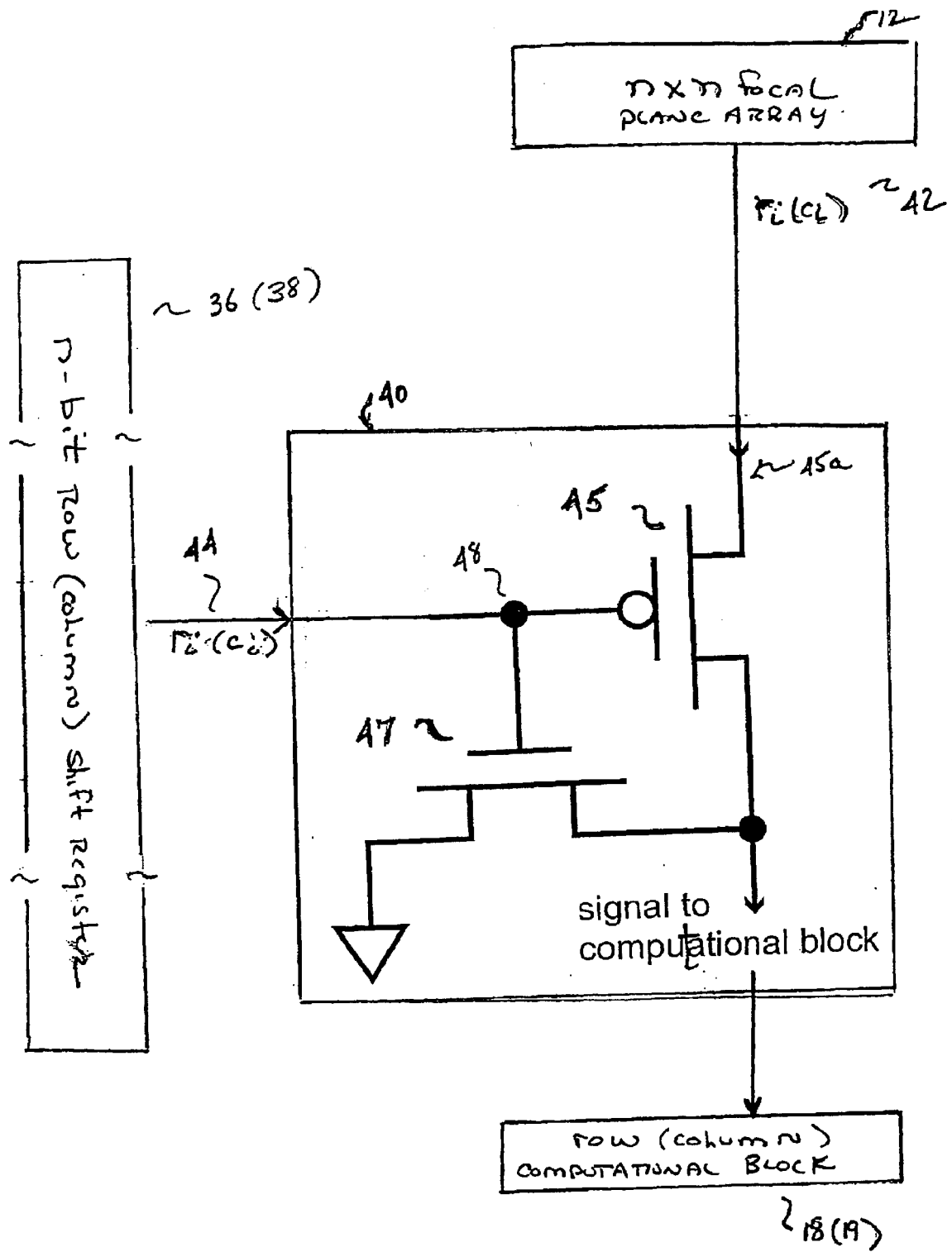
FIG. 4 is a schematic of an area-of-interest (AOI) circuit which is a component of the focal plane processor of FIG. 3.

FIG. 4 is a detailed schematic of an area of interest (AOI) circuit 40. AOI circuit 40 illustrates the construction of each of the respective row and column AOI circuits 33a–n, 35a–n of FIG. 3. As previously described, each AOI circuit receives a summed row (column) current 42 from the n×n focal plane imaging array 12. Each AOI circuit 40 includes a pFET 45 which functions as a pass/don't pass transistor. AOI circuit 40 also includes an nFET transistor 47 which acts as a shunt to ground. A summed row (column) signal 42 is supplied to one terminal 45a of pFET 45. The signal is either passed through to the row (column) computational block 18 (19) dependent upon the control signal 44 (i.e., 0 or 1) supplied from the x-axis (y-axis) n-bit shift register 36 (38). A control signal 44 (bit value) of "0" supplied from the n-bit row (column) shift register 36 (38) indicates that the particular row $r_i$ (column $ci$) does not contain a non-uniformity, or a portion thereof In this case, the pFET 45 is turned "on" and the nFET 47 is turned "off" which allows the summed ith row (column) current 42 to pass through to the computational block 18 (19). In this case, the AOI circuit 40 behaves as a resistor to permit the current flow.

In the case where the control signal 44 (bit value), supplied from the n-bit row $r_i$ (column $c_i$) shift register 36 (38) is a "1" indicating the particular row (column) contains at least some portion of an error source to be removed, the pFET 45 is turned "off" and the nFET 47 is turned "on". Under this condition, the row (column) signal 42 received by the computational block is zero and does not contribute to the computation.

In this case, the summed ith row (column) current from the focal plane n×n array 12 is blocked. In order to avoid a floating point input to the computational block 18 (19), the nFET 47 shunts this node to ground.

A second embodiment of a focal plane processor will be described with reference to FIG. 5. In the second embodiment of the invention, it is recognized that because identified row and current signals are not used by the computational block 18, 19 there is no requirement to actually sum the respective pixels that make up the removed rows and/or columns. This is achieved in one way by holding the cathode of the diode at a fixed voltage (e.g., $V_{DD}$). This prevents transistors M2 and M3 from passing any current to the row $r_i$ and column $c_i$ summing lines.

Figure 2:
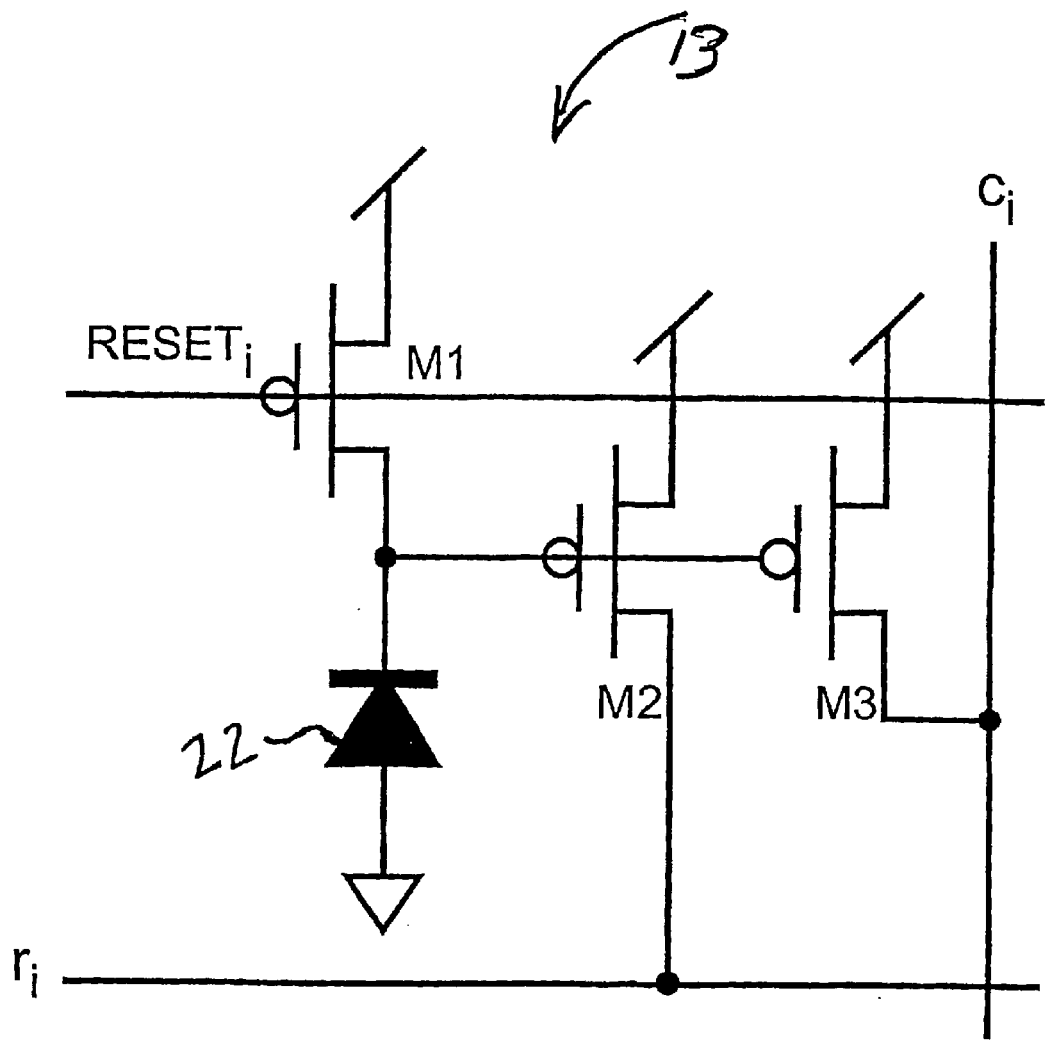
FIG. 2 is a schematic of a representative pixel which is a component of the imaging array of the focal plane processor of FIG. 1.
Figure 5:
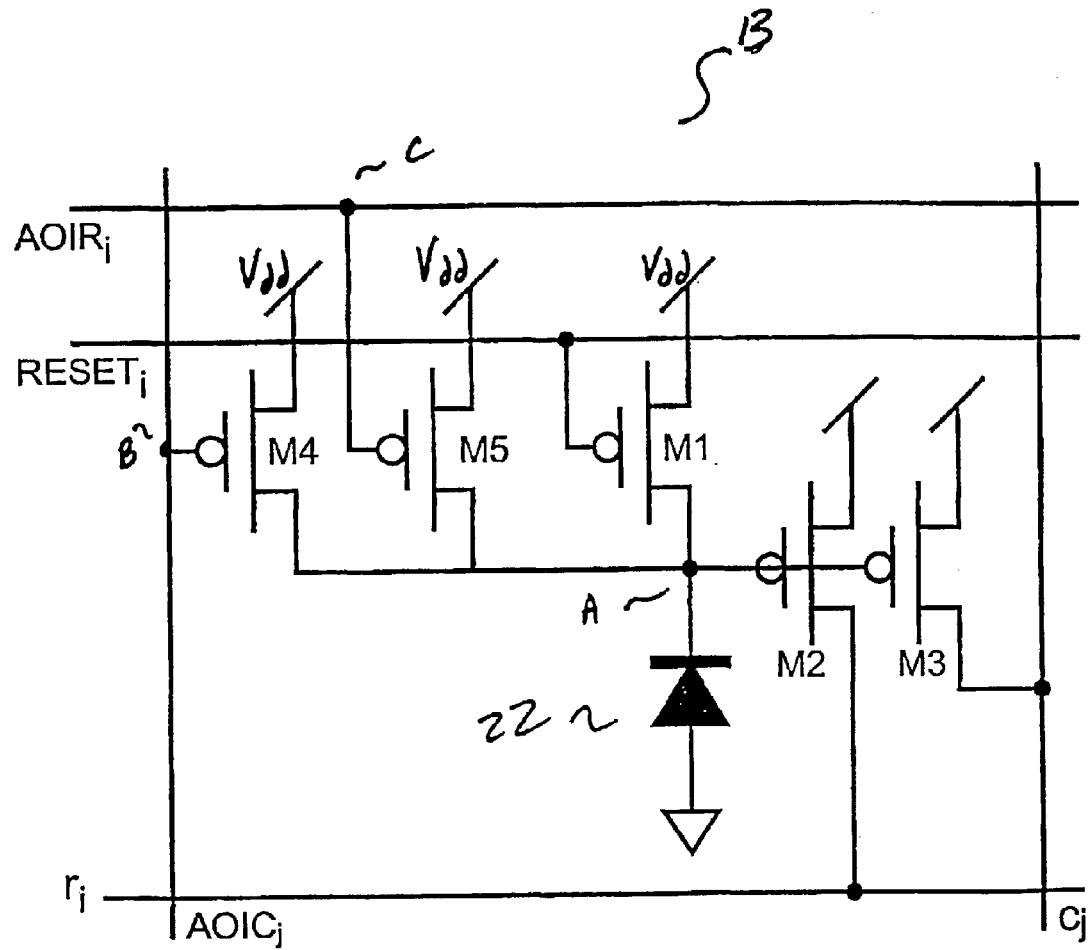
FIG. 5 is a detailed schematic of a representative pixel of the imaging array of the focal plane processor of FIG. 3, according to a second embodiment of the present invention.

FIG. 5 is an illustration of an array pixel 13 which incorporates the AOI function internally by holding the pixel 13 in "reset" such that transistors M2 and M3 do not contribute current to the row $r_i$ and column $c_i$ summing lines. The array pixel 13 of FIG. 5 is distinguished from the one described in FIG. 2 in that two transistors, M4 and M5, are added. Transistor M4 is controlled (see point B) by a binary signal from the AOI column shift register, $AOIC_j$, while transistor M5 is controlled (see point C) by a bit from the AOI row shift register, $AOIR_i$. If either shift register presents a "0" value to the pixel, the cathode of the diode 22, (see point A), becomes clamped to a fixed voltage (e.g., $V_{DD}$) and no current is applied to the respective row $r_i$ and column $c_i$ current summing lines. This approach eliminates the necessity of having a separate AOI circuit block at the periphery of the array as described in the first embodiment. It is noted that the clamping voltage can be other $V_{DD}$. It is further contemplated to utilize two voltages for switching therebetween. In the present embodiment, the AOI (switching) function is performed as an integral part of the pixel 13. This is distinguished from the first embodiment which required the AOI circuit block to perform the switching function.

Figure 6:
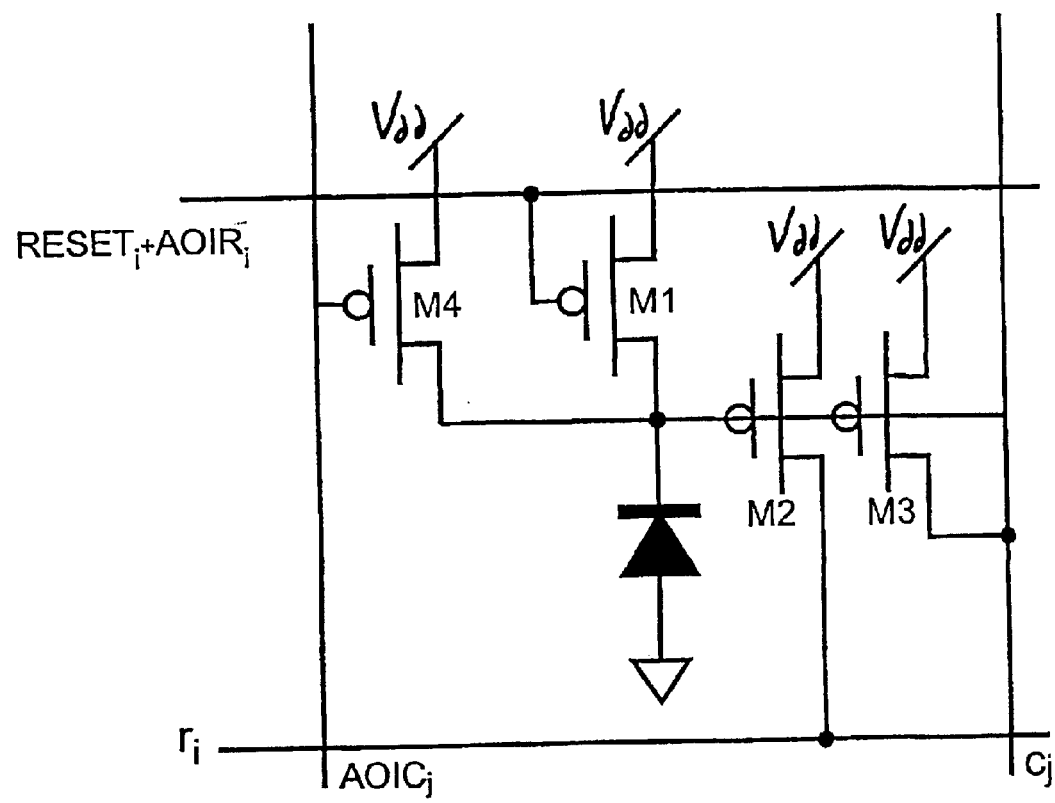
FIG. 6 is a detailed schematic of a modified representative pixel of the imaging array of the focal plane processor of FIG. 5, according to the second embodiment of the present invention.

As shown in FIG. 6, a further modification to the second embodiment may be realized by noting that both the AOIRi and RESETi signals are common for all pixels in a given row. Since a pixel is held in "reset" if either of these signals is held low, transistor M5 can be removed and transistor M1 is then driven with a signal that is the logical OR of AOIRi and RESETi, while maintaining the same functionality as shown in FIG. 5.

The second embodiment is advantageous in that the AOI function is performed as an integral part of the pixel. That is, it provides advantages over the first embodiment in that it removes the necessity of having additional circuitry (i.e., a separate AOI circuit block at the periphery of the array). A third embodiment further improves on the second embodiment by providing a further capability for disabling individual and/or particular blocks of pixels which constitute a number of pixels less than an entire row or column of pixels. In the previous embodiments, disablement can only occur at the resolution of an entire row or column. The third embodiment provides a capability for isolating less than a complete row or column for removal.

Figure 7:
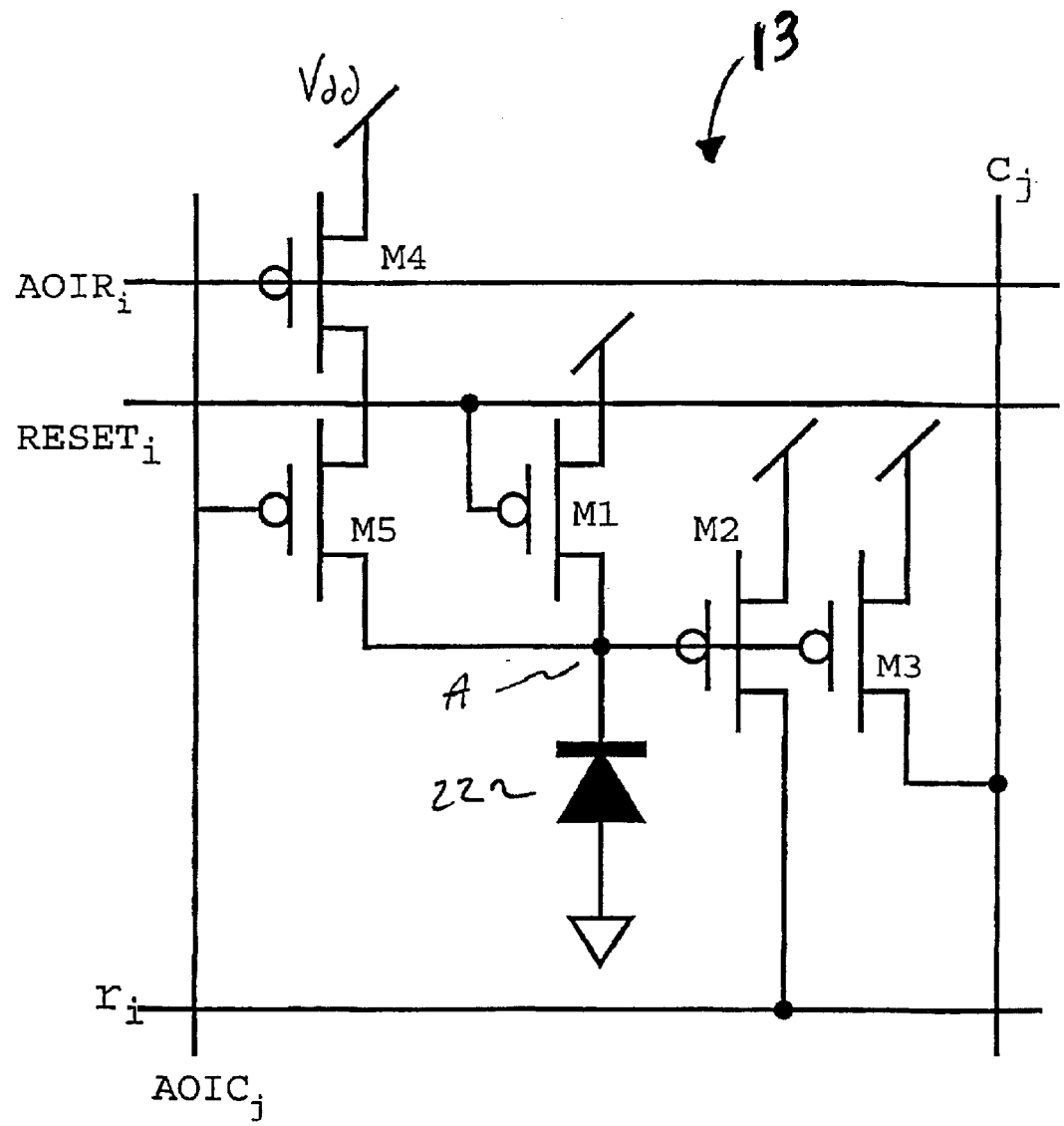
FIG. 7 is a detailed schematic of a representative pixel according to a third embodiment of the present invention.

FIG. 7 is an illustration of an array pixel 13 which provides the above stated capability. In the third embodiment, transistors M4 and M5 are connected in series. As shown, the gate of transistor M4 receives a control signal $AOIR_i$ from the row n-bit shift register. Also, the gate of transistor M5 receives a control signal $AOIC_j$ from the column n-bit AOI shift register. In the case where both control signals (i.e., $AOIR_i$ and $AOIC_j$) are low, both transistors M4 and M5 are turned 'on' which causes the pixel 13 to be held in "reset". That is, when both control signals are low, the $V_{dd}$ voltage, which is maintained at the upper terminal of transistor M4 is passed through the open switches (i.e., transistors M4 and M5) and appears at point A. When point A (the cathode of the diode 22) is at the $V_{dd}$ voltage level, the gates of transistors M2 and M3 are high and therefore prevented from conducting and therefore contributing any current from pixel 13. Conversely, if either control signal $AOIR_i$ and $AOIC_j$ is high, voltage $V_{dd}$ cannot occur at point A. As such, the pixel 13 will contribute some current to the row and current summing lines.

It is noted that the second and third embodiments differ from the first embodiment in their structure. In particular, the AOI function which is implemented by a plurality of AOI blocks in the first embodiment is alternatively implemented internally in each pixel element in the second and third embodiments thereby removing the necessity of including AOI structures in both the second and third embodiments.

While the present invention has been described with respect to a limited number of embodiments, those skilled in the art will appreciate numerous modifications and variations therefrom. It is intended that the appended claims cover all such modifications and variations as falling within the true spirit and scope of the present invention.

What is claimed is:

1. A focal plane array processor comprising:
   a focal plane array including a plurality of pixels arranged in a matrix configuration for forming an image;
   computational circuitry for receiving a plurality of processed signals for computing a desired property of said formed image; and
   processing circuitry for receiving a plurality of signals from said focal plane array and transmitting said plurality of processed signals to said computational circuitry,
   herein the processing circuitry includes a first plurality of area-of-interest (AOI) circuits wherein each of said first plurality of area-of-interest (AOI) circuits receives at a first input a summed ith row current from an ith row of said focal plane array as one of said plurality of signals and receives at a second input a corresponding ith control signal from among a plurality of control signals stored in a row n-bit shift register,
   wherein said control signal is a binary signal set to one of a signal-passing and non-signal-passing value for respectively including and not including said summed ith row current in computing said desired property,
   wherein each of the first plurality of area-of-interest (AOI) circuits comprises at least a first transistor and a second transistor, the gates of said first and second transistors being coupled at a common node, said common node connected to said second input to receive said control signal from said row n-bit shift register.

2. The focal plane array processor of claim 1, wherein said first transistor is a pFET transistor and said second transistor is an nFET transistor.

3. The focal plane array processor of claim 1, wherein said first transistor passes said summed ith row current from an ith row of said focal plane array to said computational circuitry when said control signal is set to a signal-passing value.

4. A focal plane array processor comprising:
   a focal plane array including a plurality of pixels arranged in a matrix configuration for forming an image;
   computational circuitry for receiving a plurality of processed signals for computing a desired property of said formed image; and
   processing circuitry for receiving a plurality of signals from said focal plane array and transmitting said plurality of processed signals to said computational circuitry,
   wherein the processing circuitry includes a second plurality of area-of-interest (AOI) circuits wherein each of said second plurality of area-of-interest (AOI) circuits receives at a first input a summed ith column current from an ith column of said focal plane array as one of said plurality of signals and receives at a second input a corresponding ith control signal from a column n-bit shift register as one of a plurality of signals from said column n-bit shift register,
   wherein each of the second plurality of area-of-interest (AOI) circuits comprises at least a first transistor and a second transistor, the gates of said first and second transistors being coupled at a common node, said common node connected to said second input to receive said control signal from said column n-bit shift register.

5. The focal plane array processor of claim 3, wherein said control signal is a binary signal set to one of a signal-passing and non-signal-passing value for respectively including and not including said summed ith column current in computing said desired property.

6. The focal plane array processor of claim 4, wherein said first transistor is a pFET transistor and said second transistor is an nFET transistor.

7. The focal plane array processor of claim 4, wherein said first transistor passes said summed ith current from an ith column of said focal plane array to said row n-bit shift register when said control signal is set to a signal-passing value.

8. A focal plane array processor having computational circuitry and a focal plane array having a plurality of pixel elements arranged in a matrix configuration for forming an image, wherein each of said plurality of pixel elements is constructed to:
   receive a row control signal for one of preventing and permitting a row current signal from being passed to said computational circuitry; and receive a column control signal for one of preventing and permitting a column current signal from being passed to said computational circuitry,
   wherein said plurality of pixel elements include a row control transistor including a gate for receiving said row control signal.

9. A focal plane array processor having computational circuitry and a focal plane array having a plurality of pixel elements arranged in a matrix configuration for forming an image, wherein each of said plurality of pixel elements is constructed to:
   receive a row control signal for one of preventing and permitting a row current signal from being passed to said computational circuitry; and receive a column control signal for one of preventing and permitting a column current signal from being passed to said computational circuitry,
   wherein said plurality of pixel elements include a column control transistor including a gate for receiving said column control signal.

10. A method for correcting non-uniformities in a focal plane array of a focal plane array processor where the focal plane array includes a plurality of pixels arranged in a matrix configuration for forming an image, the method comprising the steps of:
   initializing processing circuitry to store data indicative of at least one row and/or at least one column which are to be removed from further processing; and
   removing said non-uniformities in said focal plane array from further processing using said processing circuitry,
   further comprising the step of analyzing an image generated by said focal plane array processor to identify said non-uniformities.

11. The method of claim 10, wherein the step of analyzing the image further comprises the steps of:
   visually inspecting said image; and
   identifying those rows and/or columns which contribute to said non-uniformities in said image.

12. The method of claim 10, wherein the step of initializing processing circuitry further comprises the steps of:
   initializing an n-bit row shift register with control signal values indicating one of a presence of and an absence of at least a portion of at least one of said non-uniformities; and
   initializing an n-bit column shift register with control signal values indicating one of the presence of and absence of at least a portion of at least one of said non-uniformities.

13. The method of claim 10, wherein the step of removing said non-uniformities in the focal plane array from further processing in said focal plane array further comprises the steps of:
   providing said initialized n-bit row shift register control signal values to corresponding area-of-interest (AOI) circuits for one of preventing and permitting a signal from being passed to said computational circuitry; and
   providing said initialized n-bit column shift register control signal values to respective column area-of-interest (AOI) circuits for one of preventing and permitting a signal from being passed to said computational circuitry.

14. The method of claim 10, wherein the step of removing said at least one non-uniformity in the focal plane array from further processing in said focal plane array further comprises the steps of:
   providing said initialized n-bit row shift register control signal values to said plurality of pixels for one of preventing and permitting a row pixel current signal from being passed to said computational circuitry; and
   providing said initialized n-bit column shift register control signal values to respective column area-of-interest (AOI) circuits for one of preventing and permitting a column pixel current signal from being passed to said computational circuitry.

* * * * *